United States Patent
Miura et al.

(10) Patent No.: US 10,530,351 B2
(45) Date of Patent: Jan. 7, 2020

(54) DUTY COMPENSATION DEVICE

(71) Applicant: THINE ELECTRONICS, INC., Tokyo (JP)

(72) Inventors: Satoshi Miura, Tokyo (JP); Yusuke Fujita, Tokyo (JP)

(73) Assignee: THINE ELECTRONICS, INC., Chiyoda-ku, Tokyo (JP)

( * ) Notice: Subject to any disclaimer, the term of this patent is extended or adjusted under 35 U.S.C. 154(b) by 0 days.

(21) Appl. No.: 16/420,564

(22) Filed: May 23, 2019

(65) Prior Publication Data

US 2019/0363704 A1 Nov. 28, 2019

(30) Foreign Application Priority Data

May 24, 2018 (JP) .................................. 2018-099477

(51) Int. Cl.
| | |
|---|---|
| *H03K 5/156* | (2006.01) |
| *H03L 7/099* | (2006.01) |
| *H03L 7/091* | (2006.01) |
| *H03K 5/135* | (2006.01) |

(52) U.S. Cl.
CPC ........... *H03K 5/1565* (2013.01); *H03K 5/135* (2013.01); *H03L 7/091* (2013.01); *H03L 7/0995* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,716,508 B1* | 7/2017 | Zhang | ................ | H03M 1/0678 |
| 9,882,570 B1* | 1/2018 | Forey | ................ | H03G 3/20 |
| 2008/0211578 A1* | 9/2008 | Morishima | ........... | H02M 3/157 |
| | | | | 341/143 |
| 2009/0102514 A1* | 4/2009 | Hsu | ................ | G01R 29/0273 |
| | | | | 327/33 |
| 2009/0140785 A1* | 6/2009 | Choi | ................ | H03K 5/1565 |
| | | | | 327/175 |
| 2010/0201413 A1* | 8/2010 | Miyano | ................ | G11C 7/1051 |
| | | | | 327/158 |
| 2013/0063191 A1 | 3/2013 | Patil et al. | | |

(Continued)

FOREIGN PATENT DOCUMENTS

JP 2012010118 A 1/2012

*Primary Examiner* — Adam D Houston
(74) *Attorney, Agent, or Firm* — Sughrue Mion, PLLC

(57) ABSTRACT

A duty compensation device of one embodiment has a structure capable of more accurately setting a duty of a clock within an appropriate range. The duty compensation device comprises a duty adjusting unit, a duty measuring unit, a controlling unit. The duty measuring unit generates a sampling clock of a frequency $f_n$ that is asynchronous to the clock over an n-th period $T_n$ (n=1 to N and N is an integer of 3 or more), and obtains measurement information for specifying the duty of the clock by using the sampling clock. The controlling unit determines a control code to be given to the duty adjusting unit based on control code candidates obtained for each of the N periods $T_1$ to $T_N$ and the control code candidates in which the duty specified by measurement information obtained by the duty measuring unit is within a predetermined range.

4 Claims, 9 Drawing Sheets

(56) References Cited

U.S. PATENT DOCUMENTS

| | | | |
|---|---|---|---|
| 2013/0070537 A1* | 3/2013 | Sato | G11C 7/1057 |
| | | | 365/189.05 |
| 2013/0135775 A1* | 5/2013 | Yao | H02H 9/025 |
| | | | 361/18 |
| 2014/0375226 A1* | 12/2014 | Han | H05B 33/0815 |
| | | | 315/224 |
| 2015/0222254 A1* | 8/2015 | Walker | H03K 5/05 |
| | | | 327/175 |
| 2016/0006596 A1* | 1/2016 | Dickson | H04L 27/364 |
| | | | 375/298 |
| 2016/0241249 A1 | 8/2016 | Balamurugan et al. | |
| 2017/0222796 A1* | 8/2017 | Chen | H04L 7/0337 |
| 2017/0310412 A1* | 10/2017 | Gupta | H04J 3/0682 |
| 2019/0215146 A1* | 7/2019 | Ke | H03K 5/1565 |

\* cited by examiner

DUTY COMPENSATION DEVICE

TECHNICAL FIELD

The present invention relates to a duty compensation device that compensates for a duty of a clock.

BACKGROUND

In general, a digital circuit is designed to operate synchronously with a clock. That is, the digital circuit transitions to a new logic state at both the rising and falling timings of the clock or at either of the rising or falling timings of the clock. Alternatively, the digital circuit transitions to a new logic state at the rising or falling timing of the clock of each phase constituting a multiphase clock.

In the digital circuit, it is important that a duty of the clock is within an appropriate range. A duty of a single-phase clock is expressed by a ratio ($t_H/T$) of a high level time $t_H$ to a period T. A duty of a two-phase clock is expressed by a ratio of the high level time of one of two complementary clocks constituting the two-phase clock to the period.

If the duty of the clock is out of the appropriate range, the digital circuit may not perform a desired operation. For example, in a serializer device that converts parallel data into serial data and outputs the serial data, when the duty of the clock that indicates an output timing of each bit data of the serial data significantly differs from 0.5, a so-called even/odd jitter occurs. The even/odd jitter is a state in which lengths of periods of data of odd-numbered bits and data of even-numbered bits of the output serial data are significantly different from each other. Such a jitter may cause a malfunction. Therefore, it is important that a duty of the clock is within an appropriate range.

A device for compensating for a duty of a clock is disclosed in US Patent Application Laid-Open No. 2016/0241249 (Patent Document 1), US Patent Application Laid-Open No. 2013/0063191 (Patent Document 2), and Japanese Patent Application Laid-Open No. 2012-10118 (Patent Document 3). The duty compensation device disclosed in Patent Documents 1 to 3 includes a duty adjusting unit for adjusting the duty of the clock, and a duty measuring unit for measuring information for specifying the duty of the clock. In addition, in the duty compensation device, the duty adjusting unit adjusts the duty of the clock so that the duty of the clock measured by the duty measuring unit is within an appropriate range.

SUMMARY

The inventors have made a study of the above conventional techniques and found out the following problems. That is, in the conventional duty compensation device, a duty measurement value obtained by the duty measuring unit may be significantly different from an actual value, and therefore, the duty of the clock outputted from the duty adjusting unit may not be within the appropriate range.

The present invention has been made to solve the above-mentioned problems, and an object of the present invention is to provide a duty compensation device having a structure for enabling a duty of a clock to be set within an appropriate range more accurately.

The duty compensation device according to the present exemplary embodiment includes a duty adjusting unit, a duty measuring unit, a controlling unit. The duty adjusting unit has a first input terminal provided to take in a pre-adjustment clock, a second input terminal provided to take in a control code, and an output terminal provided to output a post-adjustment clock. The control code is a control signal for adjusting a duty of the taken-in pre-adjustment clock. The taken-in pre-adjustment clock is adjusted according to the control code. The duty measuring unit has a first input terminal provided to take in the post-adjustment clock, a second input terminal provided to take in the control signal, an output terminal provided to output measurement information for specifying a duty of the post-adjustment clock, and a sampling clock generating unit. The first input terminal of the duty measuring unit is electrically connected to the output terminal of the duty adjusting unit. The sampling clock generating unit is asynchronous to the post-adjustment clock over an n-th period $T_n$ (n=1 to N, where N is an integer greater than or equal to 3), and generates a sampling clock with a frequency that is different from the frequency in any other period. The control signal includes a frequency control signal for generating the sampling clock, and a sampling control signal for controlling a sampling operation for generating the measurement information. The controlling unit has a first output terminal provided to output the control code, a second output terminal provided to output the control signal, and an input terminal provided to take in the measurement information. The first output terminal of the controlling unit is electrically connected to the second input terminal of the duty adjusting unit. The second output terminal of the controlling unit is electrically connected to the second input terminal of the duty measuring unit. The input terminal of the controlling unit is electrically connected to the output terminal of the duty measuring unit. The controlling unit determines the control code to be given to the duty adjusting unit based on control code candidates obtained for each of the N periods $T_1$ to $T_N$. The control code candidates obtained for each of the N periods $T_1$ to $T_N$ are the control signals that the duty of the post-adjustment clock specified based on the measurement information is within a predetermined range.

DETAILED DESCRIPTION

Figure 1:
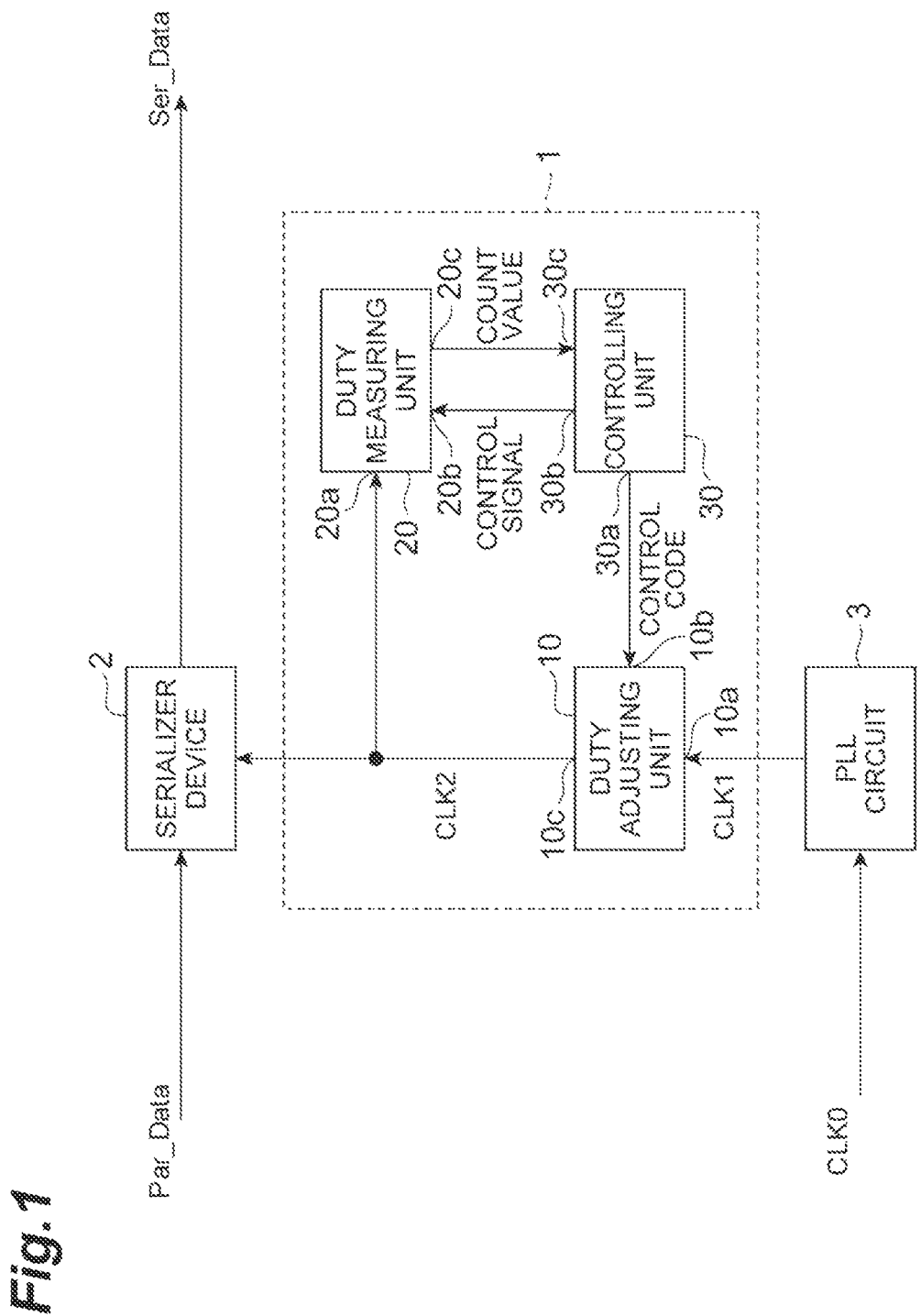
FIG. 1 is a view illustrating a configuration of a duty compensation device 1.

[Description of Exemplary Embodiment of the Present Invention]

First, the contents of exemplary embodiments of the present invention will be individually listed and described.

(1) As an aspect of the present embodiment, a duty compensation device according to the present exemplary embodiment includes a duty adjusting unit, a duty measuring unit, a controlling unit. The duty adjusting unit has a first input terminal provided to take in a pre-adjustment clock, a second input terminal provided to take in a control code, and an output terminal provided to output a post-adjustment clock. The control code is a control signal for adjusting a duty of the taken-in pre-adjustment clock. The taken-in pre-adjustment clock is adjusted according to the control code. The duty measuring unit has a first input terminal provided to take in the post-adjustment clock, a second input terminal provided to take in the control signal, an output terminal provided to output measurement information for specifying a duty of the post-adjustment clock, and a sampling clock generating unit. The first input terminal of the duty measuring unit is electrically connected to the output terminal of the duty adjusting unit. The sampling clock generating unit is asynchronous to the post-adjustment clock over an n-th period $T_n$ (n=1 to N, where N is an integer greater than or equal to 3), and generates a sampling clock with a frequency that is different from the frequency in any other period. The control signal includes a frequency control signal for generating the sampling clock, and a sampling control signal for controlling a sampling operation for generating the measurement information. The controlling unit has a first output terminal provided to output the control code, a second output terminal provided to output the control signal, and an input terminal provided to take in the measurement information. The first output terminal of the controlling unit is electrically connected to the second input terminal of the duty adjusting unit. The second output terminal of the controlling unit is electrically connected to the second input terminal of the duty measuring unit. The input terminal of the controlling unit is electrically connected to the output terminal of the duty measuring unit. The controlling unit determines the control code to be given to the duty adjusting unit based on control code candidates obtained for each of the N periods $T_1$ to $T_N$. The control code candidates obtained for each of the N periods $T_1$ to $T_N$ are the control signals that the duty of the post-adjustment clock specified based on the measurement information is within a predetermined range.

(2) According to an aspect of the present exemplary embodiment, the controlling unit may determine any control code candidate excluding the maximum value and the minimum value when the control code candidates obtained for each of the N periods $T_1$ to $T_N$ are arranged in ascending or descending order as a control code to be given to the duty adjusting unit. According to an aspect of the present exemplary embodiment, the controlling unit may determine a control code of a median value when the control code candidates obtained for each of the N periods $T_1$ to $T_N$ are arranged in ascending or descending order as a control code to be given to the duty adjusting unit.

(3) According to an aspect of the present exemplary embodiment, the sampling clock generating unit may include a ring oscillator in which a plurality of delay cells are connected to each other in a ring shape, and a current source that supplies a current to each of the plurality of delay cells. The ring oscillator generates a sampling clock of a frequency corresponding to an amount of current supplied by the current source.

Hereinabove, each of the aspects listed in the column of "Description of Exemplary Embodiment of the Present Invention" may be applied to each of the remaining aspects or to all combinations of the remaining aspects.

[Detail of Exemplary Embodiment of the Present Invention]

Hereinafter, a detailed structure of a duty compensation device according to the present exemplary embodiment will be described in detail with reference to the accompanying drawings. It is to be understood, however, that the present invention is not limited to the examples, but is intended to cover all modifications within the meaning and range of equivalents to the scope of the claims. In addition, in the description of the drawings, the same elements are denoted by the same reference numerals, and redundant explanations are omitted.

FIG. 1 is a view illustrating a configuration of a duty compensation device 1. In addition to the duty compensation device 1, a serializer device 2 and a PLL circuit 3 are also illustrated in FIG. 1. The PLL circuit 3 inputs a reference clock CLK0 to generate a clock CLK1 for instructing the output timing of a serial data in the serializer device 2 based on the reference clock CLK0 and outputs the generated clock CLK1. The duty compensation device 1 is inserted between the PLL circuit 3 and the serializer device 2. The duty compensation device 1 inputs the clock CLK1 outputted from the PLL circuit 3 to adjust a duty of the clock CLK1 (pre-adjustment clock), and outputs a post-duty adjustment clock CLK2 (post-adjustment clock) to the serializer device 2. The serializer device 2 serializes input parallel data Par_Data and outputs serial data Ser_Data. When outputting the serial data Ser_Data, the serializer device 2 outputs each bit data of the serial data Ser_Data in synchronization with the clock CLK2.

The duty compensation device 1 includes a duty adjusting unit 10, a duty measuring unit 20, and a controlling unit 30. The duty adjusting unit 10 has a first input terminal 10a, a second input terminal 10b, and an output terminal 10c. The duty measuring unit 20 has a first input terminal 20a electrically connected to the output terminal 10c of the duty adjusting unit 10, a second input terminal 20b, and an output terminal 20c. The controlling unit 30 has a first output terminal 30a electrically connected to the second input terminal 10b of the duty adjusting unit 10, a second output terminal 30b electrically connected to the second input terminal 20b of the duty measuring unit 20, and an input terminal 30c electrically connected to the output terminal 20c of the duty measuring unit 20.

The duty adjusting unit 10 takes in the clock CLK1 outputted from the PLL circuit 3 through the first input terminal 10a and takes in the control code outputted from the first output terminal 30a of the controlling unit 30 through the second input terminal 10b. The duty adjusting unit 10 adjusts the duty of the clock CLK1 (pre-adjustment clock) according to the taken-in control code, and outputs the clock CLK2 (post-adjustment clock) to the serializer device 2 and the duty measuring unit 20 through the output terminal 10c.

The duty measuring unit 20 takes in the clock CLK2 outputted from the output terminal 20c of the duty measuring unit 20 through the first input terminal 20a, and measures information for specifying the duty of the taken-in clock CLK2. The duty measuring unit 20 includes a sampling clock generating unit for generating a sampling clock that is asynchronous to the clock CLK2. The duty measuring unit 20 detects a signal level of the clock CLK2 at the timing indicated by the sampling clock, and generates information for specifying the duty of the clock CLK2 based on the detection result of the signal level.

The sampling clock generating unit of the duty measuring unit 20 generates a sampling clock of a frequency $f_n$ which is asynchronous to the clock CLK2 over an n-th period $T_n$ (n=1 to N, where N is an integer greater than or equal to 3). The frequency $f_n$ of the sampling clock that is generated in the period $T_n$ is different from frequencies of the sampling clocks that are generated in any other periods. During the period $T_n$, the duty measuring unit 20 collects duty information of the clock CLK2 using the sampling clock of the frequency $f_n$.

The controlling unit 30 outputs a control code for controlling the duty adjustment in the duty adjusting unit 10 to the duty adjusting unit 10 through the first output terminal 30a. The controlling unit 30 outputs a control signal for controlling an operation of the duty measuring unit 20 to the duty measuring unit 20 through the second output terminal 30b. In addition, the controlling unit 30 sequentially takes in the measurement information from the duty measuring unit 20 in the period $T_n$ through the input terminal 30c. The controlling unit 30 requires control code candidates in which the duty specified by the measurement information of the duty measuring unit 20 for each of the N periods $T_1$ to $T_N$ is within a predetermined range. The controlling unit 30 determines a control code to be given to the duty adjusting unit 10 based on the obtained control code candidates. The determined control code is outputted from the first output terminal 30a of the controlling unit 30.

Figure 2:
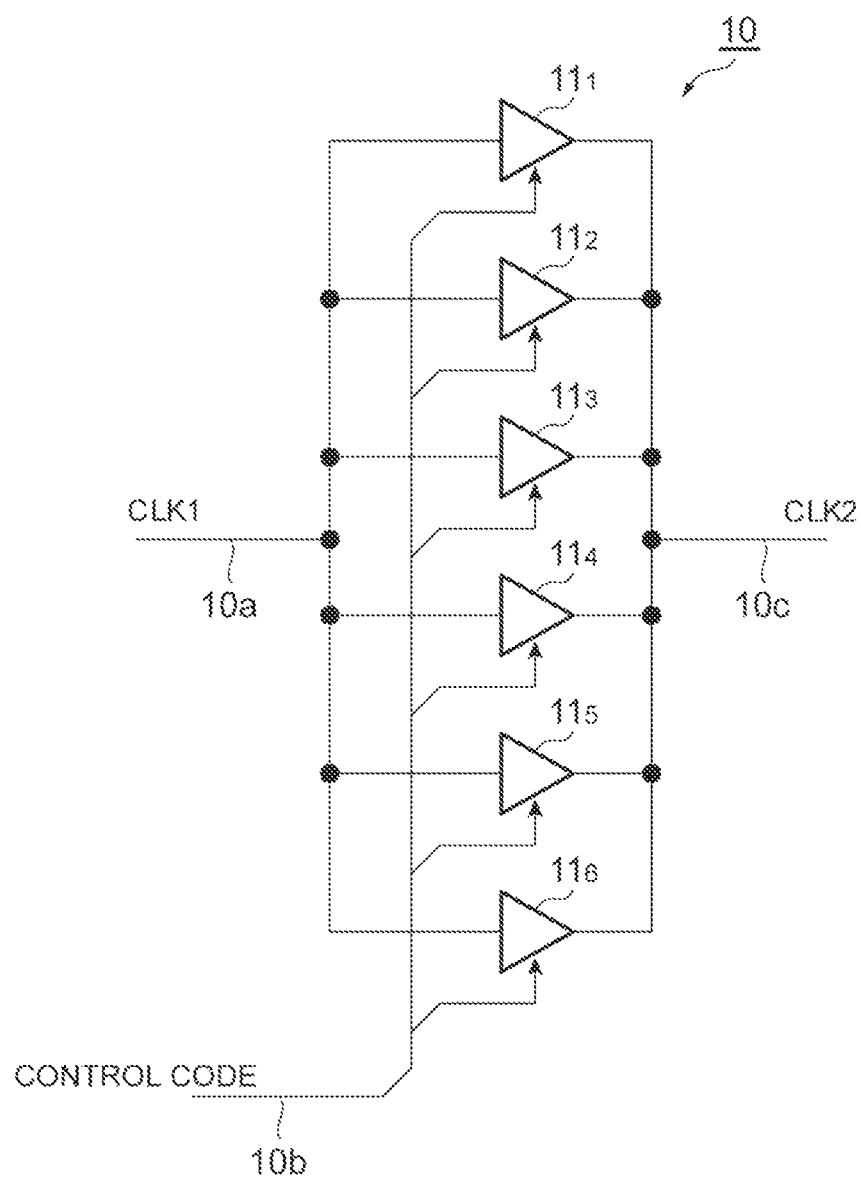
FIG. 2 is a view illustrating a configuration example of a duty adjusting unit 10.

FIG. 2 is a view illustrating a configuration example of a duty adjusting unit 10. The duty adjusting unit 10 includes a plurality of inverters $11_1$ to $11_k$ (in an example of FIG. 2, K=6) disposed in parallel between the first input terminal 10a and the output terminal 10c. The k-th inverter $11_k$ (k=1 to K) is a tri-state inverter in which a high-potential side (Rise side) and a low-potential side (Fall side) may be each controlled independently. In the inverter $11_k$, a level inversion operation is controlled by the control code given from the controlling unit 30. By the level inversion operation in each of the K inverters $11_1$ to $11_k$, the duty of the taken-in clock CLK1 is adjusted and the post-duty adjustment clock CLK2 is outputted. Further, K may be an integer greater than or equal to 2.

Figure 3:
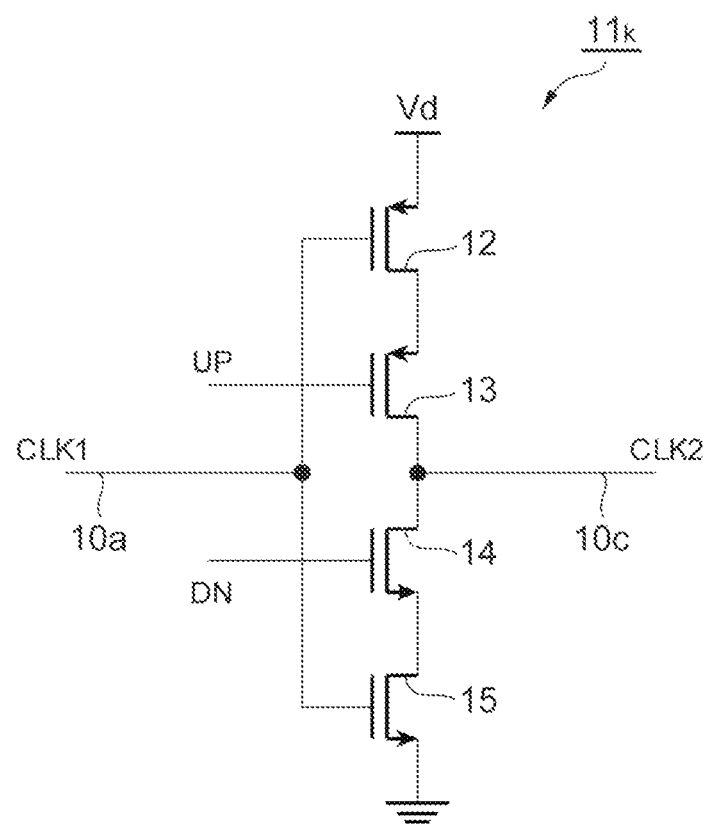
FIG. 3 is a view illustrating a circuit example of each inverter $11_k$ of the duty adjusting unit 10.

FIG. 3 is a view illustrating a circuit example of each inverter $11_k$ of the duty adjusting unit 10. The k-th inverter $11_k$ includes a PMOS transistor 12, a PMOS transistor 13, an NMOS transistor 14, and an NMOS transistor 15 which are disposed in series between a potential Vd and a ground potential GND. The PMOS transistor 12 has a source connected to the potential Vd, a gate, and a drain. The PMOS transistor 13 has a source connected to the drain of the PMOS transistor 12, a gate, and a drain connected to the output terminal 10c. The NMOS transistor 14 has a drain connected to the output terminal 10c and the drain of the PMOS transistor 13, a gate, and a source. The NMOS transistor 15 has a drain connected to the source of the NMOS transistor 14, a gate, and a source connected to the ground potential GND. The clock CLK1 is input to the gates of the PMOS transistor 12 and the NMOS transistor 15, respectively, through the first input terminal 10a. An UP signal is input to the gate of the PMOS transistor 13 to set an on/off state according to the control code taken in through the second input terminal 10b. A DN signal is input to the gate of the NMOS transistor 14 to set an on/off state according to the control code taken in through the second input terminal 10b. The clock CLK2 is outputted from the drains of the PMOS transistor 13 and the NMOS transistor 14, respectively, through the output terminal 10c.

Figure 4:
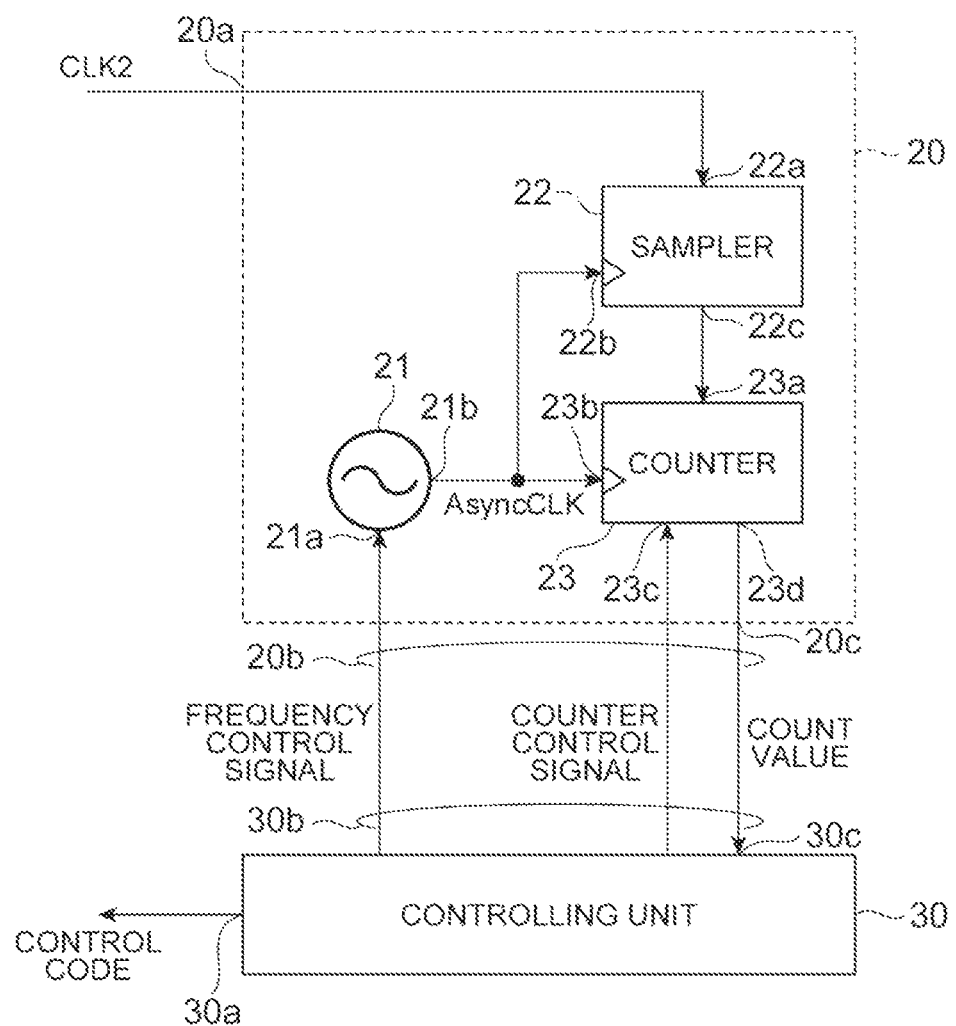
FIG. 4 is a view illustrating a configuration example of a duty measuring unit 20.

FIG. 4 is a view illustrating a configuration example of a duty measuring unit 20. In FIG. 4, the controlling unit 30 is also illustrated. The duty measuring unit 20 includes a sampling clock generating unit 21, a sampler 22, and a counter 23. The sampling clock generating unit 21 has an input terminal 21a electrically connected to the output terminal (an output terminal for outputting a frequency control signal included in the second output terminal 30b) of the controlling unit 30 through the second input terminal 20b, and an output terminal 21b. The sampler 22 includes a first input terminal 22a provided to take in the clock CK2 through the first input terminal 20a, a second input terminal 22b electrically connected to the output terminal 21b of the sampling clock generating unit 21 and provided to take in a sampling clock AsyncCLK, and an output terminal 22c. The counter 23 has a first input terminal 23a electrically connected to the output terminal 22c of the sampler 22, a second input terminal 23b electrically connected to the output terminal 21b of the sampling clock generating unit 21 and provided to take in the sampling clock AsyncCLK, a third input terminal 23c provided to take in a counter control signal (a sampling control signal) included the second output terminal 30b of the controlling unit 30 through the second input terminal 20b, and an output terminal 23d electrically connected to the input terminal 30c of the controlling unit 30 through the output terminal 20c and provided to output a count value as measurement information.

The sampling clock generating unit 21 generates a sampling clock AsyncCLK of a frequency $f_n$ over the n-th period $T_n$ based on the frequency control signal (included in the control signal supplied to the sampling clock generating unit 21 from the controlling unit 30) given from the controlling unit 30, and outputs the sampling clock AsyncCLK to the sampler 22 and the counter 23.

The sampler 22 takes in the clock CLK2 outputted from the duty measuring unit 20 and takes in the sampling clock AsyncCLK outputted from the sampling clock generating unit 21. The sampler 22 holds the signal level of the clock CLK2 by sampling the clock CLK2 at the timing indicated by the sampling clock AsyncCLK and outputs the held signal level value to the counter 23.

The counter 23 takes in the signal level value outputted from the sampler 22 and takes in the sampling clock AsyncCLK outputted from the sampling clock generating unit 21. The counter 23 counts events at which the signal level value outputted from the sampler 22 is 1 by summing the signal level values at the timings indicated by the sampling clock AsyncCLK. The counter 23 operates in accordance with the counter control signal supplied from the controlling unit 30 (the sampling control signal included in the control signal supplied from the controlling unit 30 to the sampling clock generating unit 21). That is, the counter 23 initializes the count value at the start of the period $T_n$ and outputs the count value at the end of the period $T_n$ (measurement information for specifying the duty in the period $T_n$) to the controlling unit 30.

Since the duty of the clock CLK2 is obtained from the count value at the end of the period $T_n$, the time of the period $T_n$, and the frequency $f_n$ of the sampling clock AsyncCLK of the period $T_n$, the controlling unit 30 determines the control code to be given to the duty adjusting unit 10 based on the control code candidates that the duties obtained for each of the N periods $T_1$ to $T_N$ fall within the predetermined range.

Figure 5:
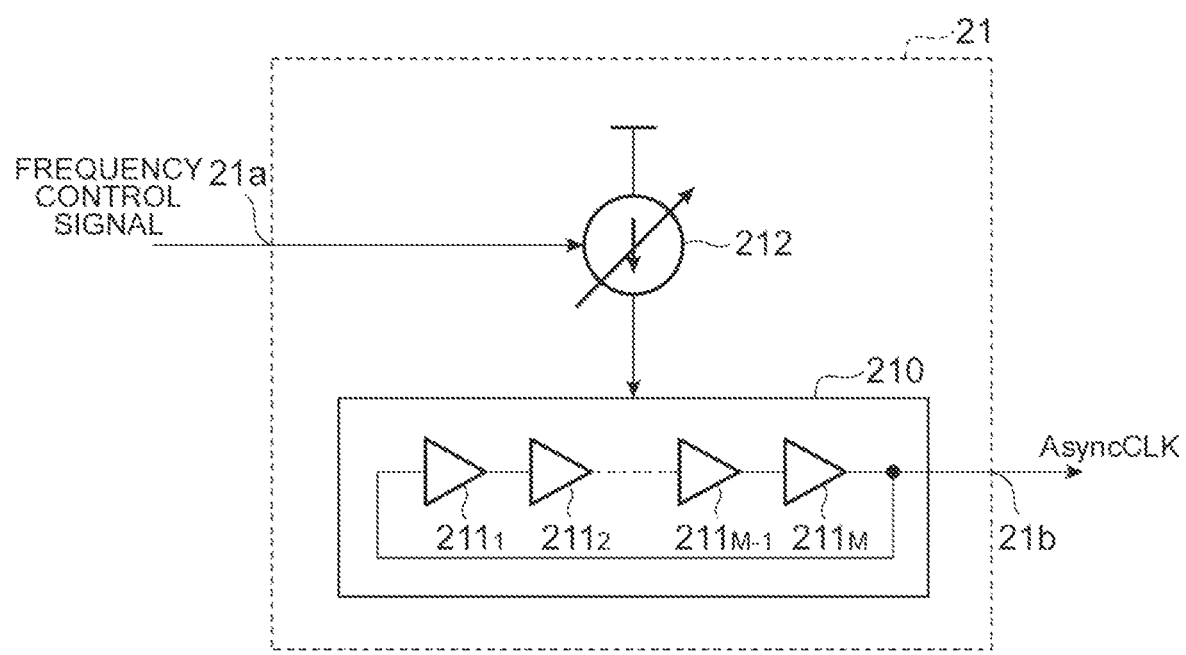
FIG. 5 is a view illustrating a circuit example of a sampling clock generating unit 21 of the duty measuring unit 20.

FIG. 5 is a view illustrating a circuit example of a sampling clock generating unit 21 of the duty measuring unit 20. The sampling clock generating unit 21 includes a ring oscillator 210 in which a plurality of delay cells $211_1$ to $211_M$ (M is an integer equal to or greater than 2) connected in a ring shape, and a current source 212 that supplies a current to each of the plurality of delay cells $211_1$ to $211_M$. An amount of current supplied from the current source 212 to the m-th delay cell $211_m$ (m=1 to M) is adjusted by a frequency control signal given from the controlling unit 30 through the input terminal 21*a*. A delay amount in the m-th delay cell $211_m$ is an amount corresponding to the amount of current supplied from the current source 212. In the sampling clock generating unit 21, a sampling clock AsyncCLK of a frequency corresponding to the amount of current supplied from the current source 212 is generated by the ring oscillator 210.

Figure 6:
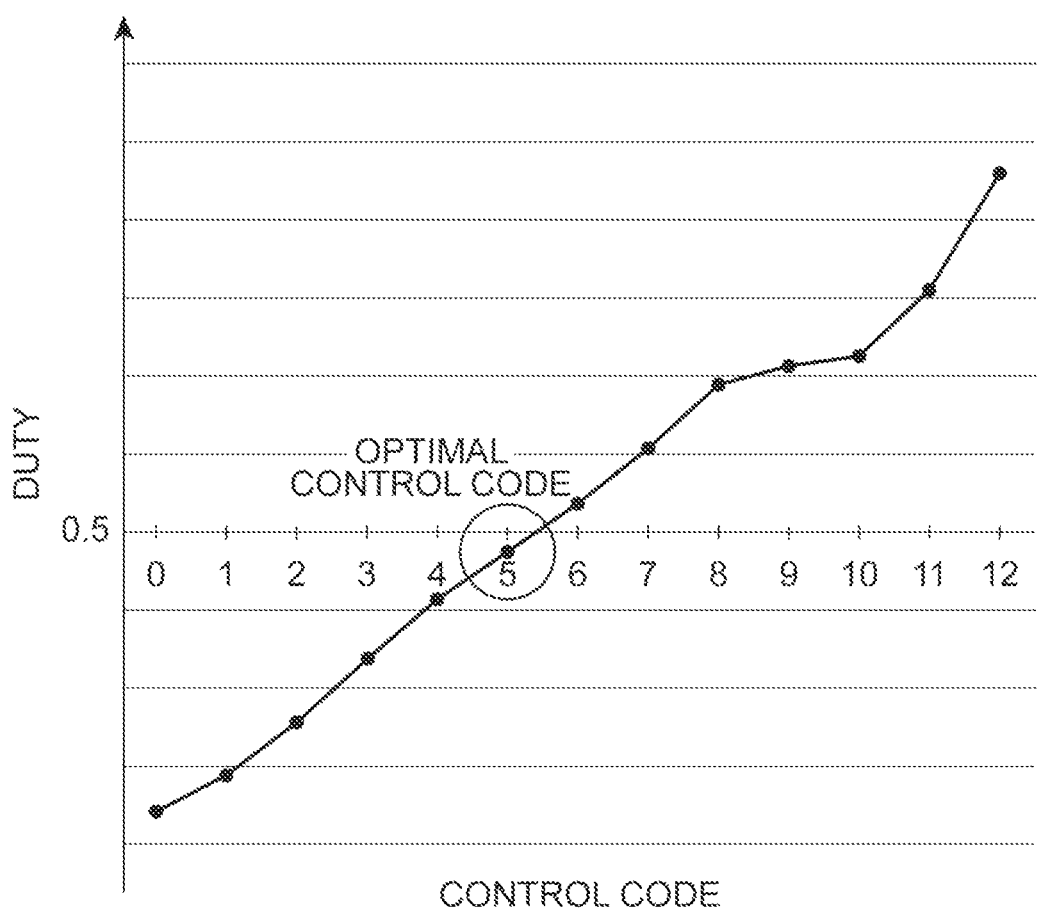
FIG. 6 is a graph illustrating an example of a relationship between a control code and a duty of a clock CLK2.

FIG. 6 is a graph illustrating an example of a relationship between a control code and a duty of a clock CLK2. A horizontal axis is the control code and a vertical axis is the duty of the clock CLK2. In an example illustrated in FIG. 6, the larger the value of the control code given to the duty adjusting unit 10 is, the larger the duty of the clock CLK 2 outputted from the duty adjusting unit 10 is. When it is desired to set the duty of the clock CLK2 to 0.5, the control code may be set to a value of 5.

The frequency of the sampling clock AsyncCLK may be higher than the frequency of the clock CLK2, but is preferably lower than the frequency of the clock CLK2. In order to increase a bit rate of the serial data Ser_Data outputted from the serializer device 2, it is necessary to increase the frequency of the clock CLK2 inputted to the serializer device 2. Increasing the frequency of the sampling clock AsyncCLK more than the frequency of the clock CLK2 involves a problem in terms of power consumption and mounting. Therefore, the frequency of the sampling clock AsyncCLK is generally set to be lower than the frequency of the clock CLK2.

The sampling number (edge density) of the signal level per one period of the clock CLK2 by the sampling clock AsyncCLK can be calculated as follows. The period of the clock CLK2 is set to Pt. The period of the sampling clock AsyncCLK is set to Pa. The remainder when Pa is divided by Pt (Pa/Pt) is set to X. The edge density can be obtained as the minimum Y in which a product (XY) of X and Y is an integer multiple of Pt. When the least common multiple of X and Pt is Z (the shortest period for returning to the same phase after one revolution), it is established that Y=Z/X. Precision at that time is Pt/Y [psec]. The edge density is set by setting the period Pa of the sampling clock AsyncCLK so that the precision becomes a target level. The edge density is preferably larger. The edge density is preferably 100 or more, more preferably 200 or more.

Figure 7:
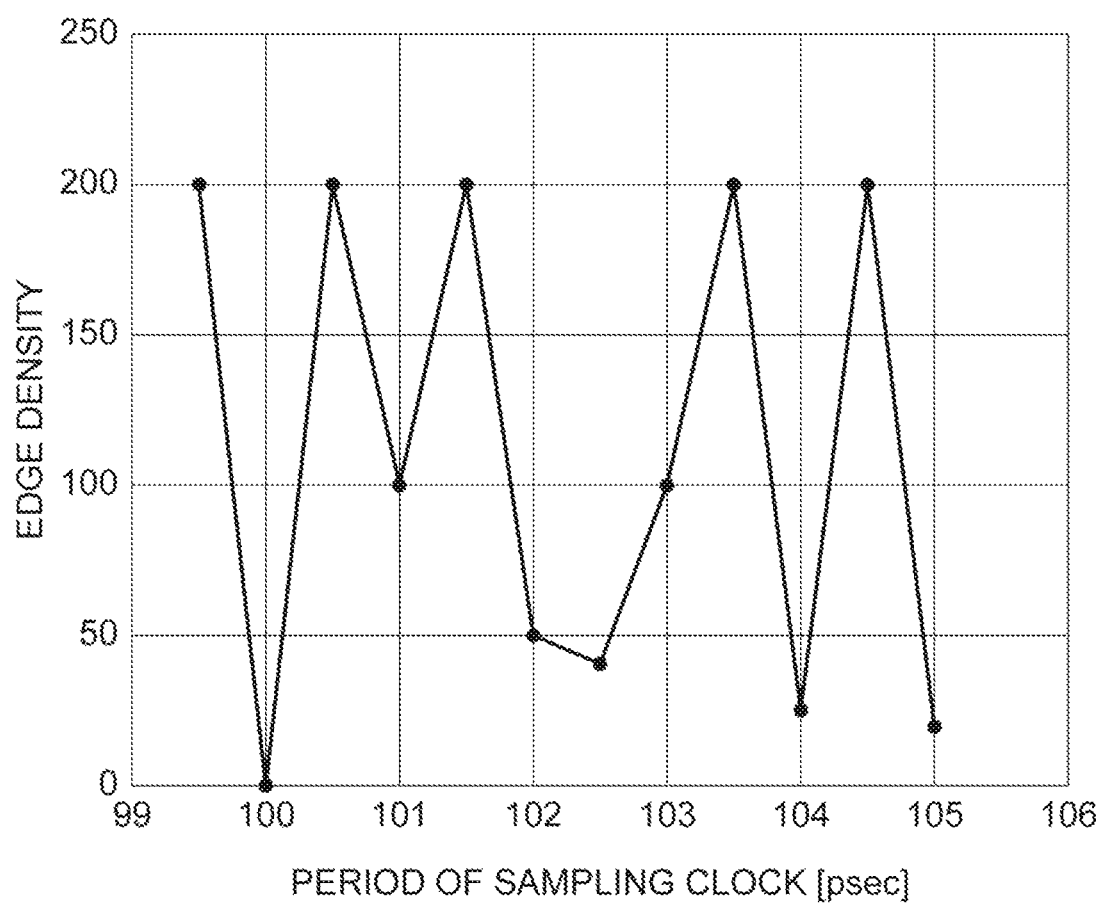
FIG. 7 is a graph illustrating a relationship between an edge density and a period of a sampling clock AsyncCLK.
Figure 8:
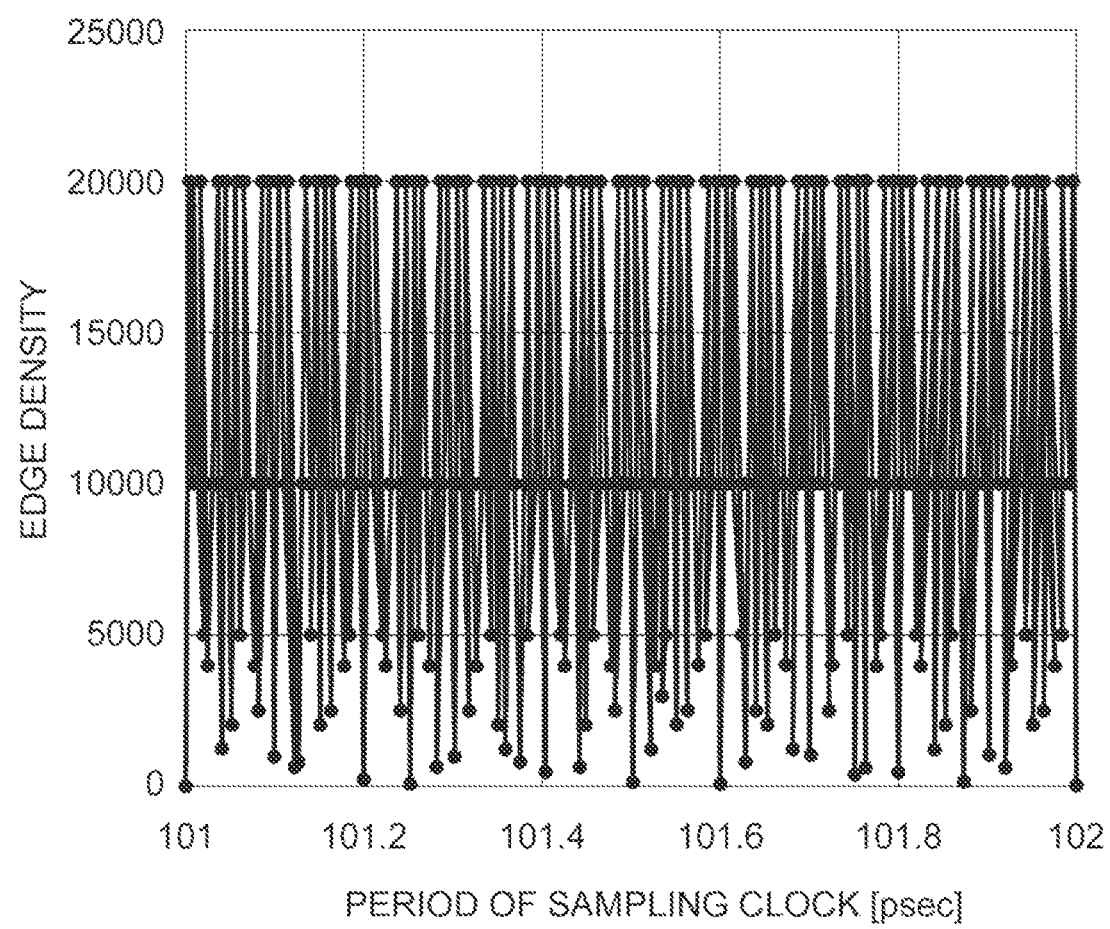
FIG. 8 is a graph illustrating a relationship between an edge density and a period of a sampling clock AsyncCLK.

FIGS. 7 and 8 are graphs illustrating a relationship between an edge density and a period of a sampling clock AsyncCLK. In both drawings, a horizontal axis is the period Pa of the sampling clock AsyncCLK and a vertical axis is an edge density. Also in FIGS. 7 and 8, the period Pt of the clock CLK2 is set to 100 ps. An interval of a set value of the period Pa of the sampling clock AsyncCLK on the horizontal axis is set to 0.5 ps in FIG. 7 and is set to 0.005 ps in FIG. 8. Between FIGS. 7 and 8, a scale of the horizontal axis is different and a scale of the vertical axis is also different. As illustrated in FIGS. 7 and 8, in order to increase the edge density, it is important to ensure the asynchrony of the sampling clock AsyncCLK for the clock CLK2. If the asynchrony of the sampling clock AsyncCLK is not ensured, the edge density becomes extremely small and the precision of the duty measurement of the clock CLK2 deteriorates. As a result, a duty compensation precision deteriorates.

Here, in the present exemplary embodiment, the sampling clock generating unit 21 of the duty measuring unit 20 generates the sampling clock of the frequency $f_n$ which is asynchronous to the clock CLK2 over the n-th period $T_n$ in which N is set to an integer equal to or greater than 3 and n is defined as any integer between 1 and N. The frequency $f_n$ of the sampling clock that is generated in the period $T_n$ is different from frequencies of the sampling clocks that are generated in any other periods ($T_1$ to $T_{n-1}$, $T_{n-1}$ to $T_N$). In the period $T_n$, the controlling unit 30 obtains a control code candidate (e.g., a control code of which duty is the closest to 0.5) in which the duty specified by the measurement result of the duty measuring unit 20 is a predetermined range. In addition, the controlling unit 30 selects a probable control code among the control code candidates obtained for each of the N periods $T_1$ to $T_N$ and then supplies the selected control code to the duty adjusting unit 10.

Figure 9:
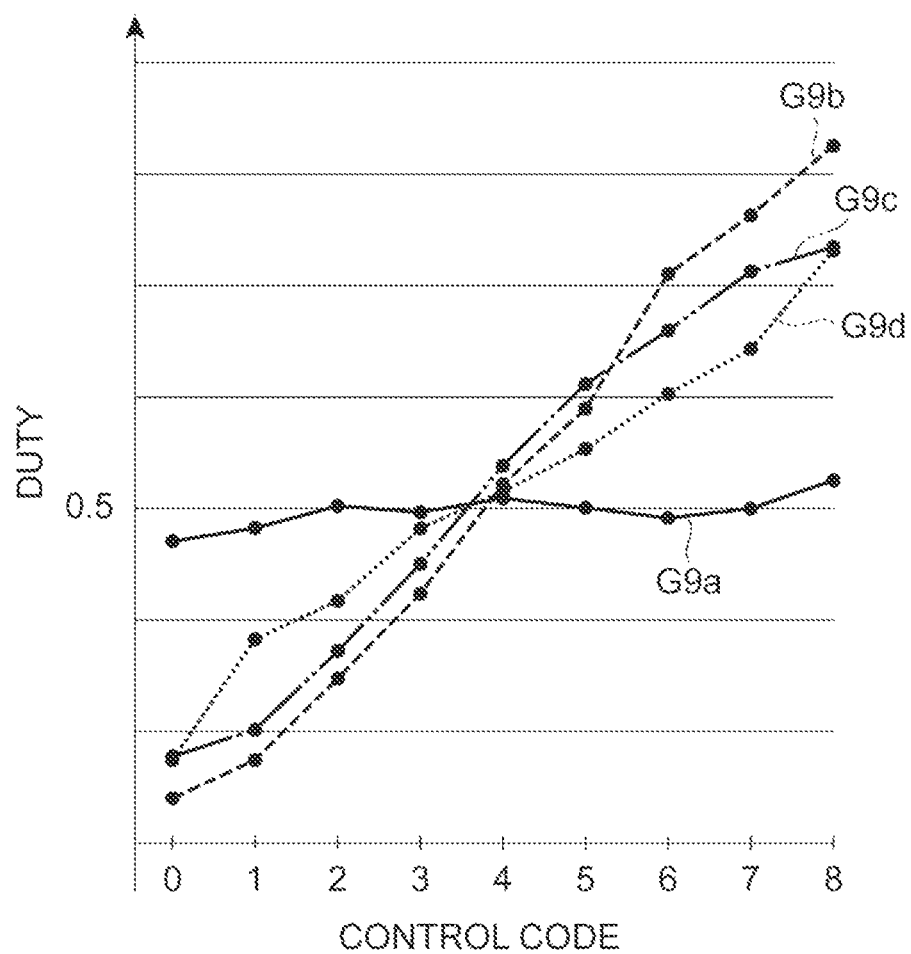
FIG. 9 is a graph illustrating an example of a relationship between a control code and a duty of a clock CLK2.

FIG. 9 is a graph illustrating an example of a relationship between a control code and a duty of a clock CLK2. In FIG. 9, N is set to 4. The frequency of the clock CLK2 is set to 7.874 GHz. A difference ΔP (=Pa−Pt) between the period Pa of the sampling clock AsyncCLK and the period Pt of the clock CLK2 was set to be varied by about 1 ps between the periods $T_1$ to $T_4$. That is, ΔP was set to 0 ps in the period $T_1$, 1.1 ps in the period $T_2$, 2.0 ps in the period $T_3$, and 2.8 ps in the period $T_4$. Graph G9*a* shows the relationship between the control code and the duty of the clock CLK2 during the period $T_1$ with ΔP=0 ps, Graph G9*b* shows the relationship between the control code and the duty of the clock CLK2 during the period $T_2$ with ΔP=1.1 ps, Graph G9*c* shows the relationship between the control code and the duty of the clock CLK2 during the period $T_3$ with ΔP=2.0 ps, and Graph G9*d* shows the relationship between the control code and the duty of the clock CLK2 in the period $T_4$ with ΔP=2.8 ps.

Since Pa=Pt in the period $T_1$ with ΔP=0 ps, the result of sampling by the sampler 22 always alternately repeats the high and low levels, and the duty is stabilized at about 0.5 regardless of the control code. Therefore, when the control code in which the duty of the clock CLK2 is 0.5 at the end of period $T_1$ is obtained, the value of the control code is undefined.

In other periods $T_2$, $T_3$, and $T_4$, since the duty of the clock CLK2 is larger as the value of the control code is larger, the value of the control code is around 4 when the control code in which the duty of the clock CLK2 is 0.5 at the end of each of the periods $T_2$, $T_3$, and $T_4$, is obtained.

The controlling unit 30 selects a probable control code from the control code candidates obtained for each of the periods $T_1$ to $T_4$ and then gives the selected control code to the duty adjusting unit 10. In this example, since the control code obtained at the end of the period $T_1$ is undefined, but the values of the control code candidates obtained at the end of each of the periods $T_2$, $T_3$, and $T_4$ are equal to 4 (or become a value close to the value of 4), the value of 4 is selected as the probable control code.

The controlling unit 30 may determine any control code candidate excluding the maximum value and the minimum value when the control code candidates are arranged in ascending or descending order at the time of selecting the probable control code from the control code candidates obtained in each of the N periods $T_1$ to $T_N$, as a control code to be given to the duty adjusting unit 10 thereafter. In addition, the controlling unit 30 may determine a control code candidate of a median value when the control code candidates obtained for each of the N periods $T_1$ to $T_N$ are arranged in ascending or descending order as a control code to be given to the duty adjusting unit 10 thereafter. In any case, an appropriate control code can be selected from the control code candidates obtained in each of the N periods $T_1$ to $T_N$ by excluding the possibility of an improper control code. Therefore, according to the present exemplary embodiment, the duty of the clock may be more accurately set within the appropriate range.

As described above, the duty compensation device according to the present exemplary embodiment can more accurately set the duty of the clock within the appropriate range.

From the above description of the present invention, it is apparent that the present invention will be modified in various ways. Such modifications are not to be construed as departing from the spirit and scope of the present invention and any improvements which are obvious to all those skilled in the art are within the scope of the following claims.

What is claimed is:

1. A duty compensation device comprising:
   a duty adjusting unit having a first input terminal provided to take in a pre-adjustment clock, a second input terminal provided to take in a control code for adjusting a duty of the taken-in pre-adjustment clock, and an output terminal provided to output a post-adjustment clock adjusted according to the taken-in control code;
   a duty measuring unit having a first input terminal electrically connected to the output terminal of the duty adjusting unit and provided to take in the post-adjustment clock, a second input terminal provided to take in a control signal, an output terminal provided to output measurement information for specifying a duty of the post-adjustment clock, and a sampling clock generating unit, the sampling clock generating unit being asynchronous to the post-adjustment clock over an n-th period $T_n$ defined by an integer N greater than or equal to 3 and any integer n of 1 to N, and generates a sampling clock of a frequency which is different from frequencies in any other periods, the control signal including a frequency control signal for generating the sampling clock and a sampling control signal for controlling a sampling operation for generating the measurement information; and
   a controlling unit having a first output terminal electrically connected to the second input terminal of the duty adjusting unit and provided to output the control code, a second output terminal electrically connected to the second input terminal of the duty measuring unit and provided to output the control signal, and an input terminal electrically connected to the output terminal of the duty measuring unit and provided to take in the measurement information, the controlling unit determining a control code to be given to the duty adjusting unit, based on control code candidates obtained for each of N periods $T_1$ to $T_N$, and the control code candidates in which the duty of the post-adjustment clock specified based on the measurement information is within a predetermined range.

2. The duty compensation device according to claim 1, wherein
   the controlling unit determines any control code candidate excluding a maximum value and a minimum value when the control code candidates obtained for each of the N periods $T_1$ to $T_N$ are arranged in ascending or descending order as the control code to be given to the duty adjusting unit.

3. The duty compensation device according to claim 1, wherein
   the controlling unit determines a control code of a medium value when the control code candidates obtained for each of the N periods $T_1$ to $T_N$ are arranged in ascending or descending order as the control code to be given to the duty adjusting unit.

4. The duty compensation device according to claim 1, wherein
   the sampling clock generating unit includes:
   a ring oscillator in which a plurality of delay cells are connected to each other in a ring shape, and a current source configured to supply a current to each of the plurality of delay cells; and
   the ring oscillator generates a sampling clock of a frequency corresponding to an amount of the current supplied by the current source.

* * * * *